United States Patent
Essawy et al.

(10) Patent No.: US 10,962,580 B2
(45) Date of Patent: Mar. 30, 2021

(54) ELECTRIC ARC DETECTION FOR PROBE HEATER PHM AND PREDICTION OF REMAINING USEFUL LIFE

(71) Applicant: Rosemount Aerospace Inc., Burnsville, MN (US)

(72) Inventors: Magdi A. Essawy, Lakeville, MN (US); Marvin Onken, Excelsior, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 16/220,823

(22) Filed: Dec. 14, 2018

(65) Prior Publication Data
US 2020/0191850 A1   Jun. 18, 2020

(51) Int. Cl.
G01R 31/00 (2006.01)
B64D 45/00 (2006.01)
(Continued)

(52) U.S. Cl.
CPC .......... *G01R 31/008* (2013.01); *B64D 15/12* (2013.01); *B64D 45/00* (2013.01); *B64F 5/60* (2017.01);
(Continued)

(58) Field of Classification Search
CPC .... G01R 31/00; G01R 31/005; G01R 31/008; G01R 31/28; G01R 31/2874;
(Continued)

(56) References Cited

U.S. PATENT DOCUMENTS

| | | | |
|---|---|---|---|
| 3,798,652 A | 3/1974 | Williams | |
| 4,207,566 A | 6/1980 | Gitlin et al. | |

(Continued)

FOREIGN PATENT DOCUMENTS

| | | |
|---|---|---|
| CA | 1311028 | 5/1989 |
| CN | 105092050 A | 11/2015 |

(Continued)

OTHER PUBLICATIONS

Bechhoefer, John, et al. "Temperature Dependence of the Capacitance of a Ferroelectric Material." in: American Journal of Physics (2007), vol. 75, No. 11, pp. 1046-1053.
Extended European Search Report for European Patent Application No. 18153822.4, dated May 17, 2018, 9 pages.
Communication Pursuant to Article 94(3) EPC for European Patent Application No. 18153822.4, dated Jan. 16, 2020, 4 pages.
Extended European Search Report for European Patent Application No. 18153825.7, dated Apr. 9, 2018, 7 pages.
Extended European Search Report for European Patent Application No. 19207401.1, dated Jan. 27, 2020, 8 pages.

(Continued)

*Primary Examiner* — Hoai-An D. Nguyen
(74) *Attorney, Agent, or Firm* — Kinney & Lange, P.A.

(57) ABSTRACT

A system for an aircraft includes an aircraft component that includes a heater routed through the aircraft component, the heater including a resistive heating element and insulation surrounding the resistive heating element. A first current flows into the resistive heating element to provide heating for the aircraft component and a second current flows out of the resistive heating element. The system further includes a first sensor configured to produce a first sensor signal representing the first current, a second sensor configured to produce a second sensor signal representing the second current, a leakage sensor configured to produce a leakage sensor signal representing a leakage current, and a signal processor configured to sample and measure the first current, the second current, and a leakage current using a high frequency sampling rate to identify the presence of electric arcing. The detection of electric arcing is used to predict future heater failure and estimate heater remaining useful life.

20 Claims, 6 Drawing Sheets

(51) Int. Cl.
*B64D 15/12* (2006.01)
*B64F 5/60* (2017.01)
*G01R 17/00* (2006.01)
*G01R 19/165* (2006.01)

(52) U.S. Cl.
CPC ...... *B64D 2045/0085* (2013.01); *G01R 17/00* (2013.01); *G01R 19/16566* (2013.01); *G01R 19/16571* (2013.01)

(58) Field of Classification Search
CPC ............... G01R 31/2875; G01R 31/30; G01R 31/3004; G01R 31/3008; G01R 31/50; G01R 31/52; G01R 27/00; G01R 27/02; G01R 27/08; G01R 19/00; G01R 19/165; G01R 19/16566; G01R 19/16571; B64F 5/00; B64F 5/60; B64D 45/00; B64D 2045/0085; B64D 15/00; B64D 15/12; G01N 17/00
USPC ....... 324/500, 511, 512, 522, 537, 600, 649, 324/691, 713, 715, 718; 702/1, 57, 58, 702/59, 64; 340/1.1, 3.1, 3.43, 3.44
See application file for complete search history.

(56) References Cited

U.S. PATENT DOCUMENTS

| | | | |
|---|---|---|---|
| 4,267,721 | A | 5/1981 | Longenecker et al. |
| 4,506,259 | A | 3/1985 | Rhodes |
| 4,698,583 | A | 10/1987 | Sandberg |
| 5,130,652 | A | 7/1992 | Kawakami et al. |
| 5,216,226 | A | 6/1993 | Miyoshi |
| 5,218,294 | A | 6/1993 | Soiferman |
| 5,464,965 | A | 11/1995 | McGregor et al. |
| 5,767,781 | A | 6/1998 | Yavelberg |
| 5,883,512 | A | 3/1999 | Streit et al. |
| 6,070,475 | A | 6/2000 | Muehlhauser et al. |
| 6,107,611 | A | 8/2000 | Jones |
| 6,151,560 | A | 11/2000 | Jones |
| 6,188,423 | B1 | 2/2001 | Pou |
| 6,218,647 | B1 | 4/2001 | Jones |
| 6,270,460 | B1 | 8/2001 | McCartan et al. |
| 6,300,767 | B1 | 10/2001 | Kliman et al. |
| 6,336,083 | B1 | 1/2002 | Lanham et al. |
| 6,400,334 | B1 | 6/2002 | Lindenmeier et al. |
| 6,414,282 | B1 | 7/2002 | Ice et al. |
| 6,414,508 | B1 | 7/2002 | London |
| 6,430,996 | B1 | 8/2002 | Anderson et al. |
| 6,476,624 | B1 | 11/2002 | Chuman et al. |
| 6,906,537 | B2 | 6/2005 | Goldberg et al. |
| 7,012,538 | B2 | 3/2006 | Peck et al. |
| 7,202,451 | B2 | 4/2007 | Uchida et al. |
| 7,209,651 | B1 | 4/2007 | Knoeppel et al. |
| 7,219,023 | B2 | 5/2007 | Banke et al. |
| 7,490,510 | B2 | 2/2009 | Agami et al. |
| 7,647,843 | B2 | 1/2010 | Burton |
| 8,182,143 | B2 | 5/2012 | Fleming et al. |
| 8,269,513 | B2 | 9/2012 | Palm et al. |
| 8,466,390 | B2 | 6/2013 | Gaertner, II et al. |
| 8,711,008 | B2 | 4/2014 | Cook et al. |
| 8,890,703 | B2 | 11/2014 | Farris et al. |
| 9,046,899 | B2 | 6/2015 | Shearer et al. |
| 9,080,917 | B2 | 7/2015 | Nguyen et al. |
| 9,463,879 | B2 | 10/2016 | Khozikov et al. |
| 9,733,135 | B2 | 8/2017 | Feau et al. |
| 9,885,761 | B2 | 2/2018 | Schram |
| 9,919,812 | B2 | 3/2018 | Shi |
| 9,927,480 | B2 | 3/2018 | Nesnidal |
| 9,939,459 | B2 | 4/2018 | Dichek |
| 10,151,785 | B2 | 12/2018 | Essawy et al. |
| 10,180,449 | B2 | 1/2019 | Essawy et al. |
| 10,197,517 | B2 | 2/2019 | Essawy et al. |
| 10,564,203 | B2 | 2/2020 | Essawy et al. |
| 2001/0054611 | A1 | 12/2001 | Miyahara et al. |
| 2002/0078752 | A1 | 6/2002 | Braunling et al. |
| 2002/0154029 | A1 | 10/2002 | Walters et al. |
| 2003/0206111 | A1 | 11/2003 | Gao et al. |
| 2004/0032270 | A1 | 2/2004 | Goldberg et al. |
| 2004/0075567 | A1 | 4/2004 | Peck et al. |
| 2004/0124358 | A1 | 7/2004 | Okamura et al. |
| 2004/0217106 | A1 | 11/2004 | Giterman |
| 2004/0243949 | A1 | 12/2004 | Wang et al. |
| 2005/0200363 | A1* | 9/2005 | Hasegawa .......... G01R 31/2805 324/523 |
| 2005/0232331 | A1 | 10/2005 | Severson |
| 2005/0232332 | A1 | 10/2005 | Hanson et al. |
| 2006/0033504 | A1 | 2/2006 | Barber et al. |
| 2006/0096971 | A1 | 5/2006 | Reusche et al. |
| 2006/0250143 | A1 | 11/2006 | Moon et al. |
| 2007/0084857 | A1 | 4/2007 | Osaka |
| 2007/0125764 | A1 | 6/2007 | Knoeppel et al. |
| 2007/0208520 | A1 | 9/2007 | Zhang et al. |
| 2008/0018340 | A1 | 1/2008 | Arnou et al. |
| 2008/0112100 | A1 | 5/2008 | Liu |
| 2008/0183404 | A1 | 7/2008 | Emami et al. |
| 2008/0250796 | A1 | 10/2008 | Clugston et al. |
| 2009/0055036 | A1 | 2/2009 | Vozhdaev et al. |
| 2009/0065502 | A1 | 3/2009 | Suenaga et al. |
| 2009/0251152 | A1 | 10/2009 | Ammann |
| 2009/0321415 | A1 | 12/2009 | Zhang et al. |
| 2010/0156426 | A1 | 6/2010 | Kang et al. |
| 2010/0163433 | A1 | 7/2010 | Horn |
| 2010/0213960 | A1 | 8/2010 | Mok et al. |
| 2010/0231249 | A1 | 9/2010 | Dang et al. |
| 2011/0036160 | A1 | 2/2011 | Pineau et al. |
| 2011/0058397 | A1 | 3/2011 | Rizzo |
| 2011/0089958 | A1 | 4/2011 | Malecki et al. |
| 2011/0106475 | A1 | 5/2011 | Wigen |
| 2011/0118990 | A1 | 5/2011 | Sidhu et al. |
| 2011/0290784 | A1 | 12/2011 | Orawetz et al. |
| 2011/0320139 | A1 | 12/2011 | Amir et al. |
| 2012/0133384 | A1 | 5/2012 | Palais et al. |
| 2012/0268074 | A1 | 10/2012 | Cooley et al. |
| 2012/0319706 | A1 | 12/2012 | Nadel et al. |
| 2013/0039565 | A1 | 2/2013 | Takeshima et al. |
| 2013/0194101 | A1 | 8/2013 | Devupalli |
| 2013/0314082 | A1 | 11/2013 | Lee et al. |
| 2014/0033175 | A1 | 1/2014 | Lee et al. |
| 2014/0103938 | A1 | 4/2014 | Jones |
| 2014/0238968 | A1 | 8/2014 | Lee |
| 2014/0245830 | A1 | 9/2014 | Martin et al. |
| 2014/0331751 | A1 | 11/2014 | Macdonald |
| 2015/0014303 | A1 | 1/2015 | Kohler et al. |
| 2015/0042980 | A1 | 2/2015 | Liu et al. |
| 2015/0055940 | A1 | 2/2015 | Steinhauser |
| 2015/0104888 | A1 | 4/2015 | Lee |
| 2015/0123688 | A1 | 5/2015 | Sappok et al. |
| 2015/0142343 | A1 | 5/2015 | Zach et al. |
| 2015/0160148 | A1 | 6/2015 | Stanley |
| 2015/0174843 | A1 | 6/2015 | Crepin et al. |
| 2016/0013169 | A1 | 1/2016 | Standing |
| 2016/0054233 | A1 | 2/2016 | Bense et al. |
| 2016/0084986 | A1 | 3/2016 | Zach et al. |
| 2016/0131690 | A1 | 5/2016 | Ueno et al. |
| 2016/0131691 | A1 | 5/2016 | Nesnidal |
| 2016/0178221 | A1 | 6/2016 | Thornton et al. |
| 2016/0178680 | A1 | 6/2016 | Ntziachristos |
| 2016/0255184 | A1 | 9/2016 | Hwang |
| 2016/0291051 | A1 | 10/2016 | Golly et al. |
| 2016/0313259 | A1 | 10/2016 | Shayovitz |
| 2016/0338569 | A1 | 11/2016 | Reder et al. |
| 2016/0364629 | A1 | 12/2016 | Solli |
| 2016/0377487 | A1 | 12/2016 | Cheung et al. |
| 2017/0099699 | A1 | 4/2017 | Nosrati et al. |
| 2017/0110887 | A1 | 4/2017 | Bell et al. |
| 2017/0167925 | A1* | 6/2017 | Safai .................. G01K 7/24 |
| 2017/0182447 | A1 | 6/2017 | Sappok et al. |
| 2017/0191875 | A1 | 7/2017 | Schmidt et al. |
| 2017/0215936 | A1* | 8/2017 | Wallace .............. A61B 18/082 |
| 2017/0259927 | A1 | 9/2017 | Schram |
| 2017/0299626 | A1 | 10/2017 | Dichek |
| 2017/0343418 | A1 | 11/2017 | Hurbi et al. |
| 2017/0370748 | A1 | 12/2017 | Fuller |

(56) References Cited

U.S. PATENT DOCUMENTS

| | | | |
|---|---|---|---|
| 2017/0370960 A1 | 12/2017 | Benning et al. | |
| 2017/0374296 A1 | 12/2017 | Schmidt | |
| 2018/0123441 A1* | 5/2018 | Yanai | H02M 1/08 |
| 2018/0183404 A1 | 6/2018 | Jourdan et al. | |
| 2018/0275080 A1 | 9/2018 | Essawy et al. | |
| 2018/0275085 A1 | 9/2018 | Fok et al. | |
| 2018/0275181 A1 | 9/2018 | Essawy et al. | |
| 2018/0275182 A1 | 9/2018 | Essawy et al. | |
| 2018/0275183 A1 | 9/2018 | Essawy et al. | |
| 2018/0275184 A1 | 9/2018 | Essawy et al. | |
| 2018/0275185 A1 | 9/2018 | Essawy et al. | |
| 2018/0290756 A1* | 10/2018 | White | B64D 11/02 |
| 2019/0297675 A1 | 9/2019 | Vadgaonkar et al. | |
| 2020/0011761 A1* | 1/2020 | Pado | G01M 5/0016 |
| 2020/0191851 A1 | 6/2020 | Essawy et al. | |

FOREIGN PATENT DOCUMENTS

| | | |
|---|---|---|
| CN | 109246868 A | 1/2019 |
| CN | 109521252 A | 3/2019 |
| EP | 1441429 A1 | 7/2004 |
| EP | 2755443 A2 | 7/2014 |
| EP | 3018057 A1 | 5/2016 |
| EP | 3281874 A1 | 2/2018 |
| EP | 3379266 A1 | 9/2018 |
| GB | 809608 | 2/1959 |
| GB | 884415 | 12/1961 |
| GB | 2561393 A | 10/2018 |
| JP | 2006088391 A | 4/2006 |
| JP | 2012198123 A | 10/2012 |
| KR | 20110124542 A | 11/2011 |
| KR | 101110789 B1 | 2/2012 |
| KR | 20120062301 A | 6/2012 |
| WO | WO9011532 A1 | 10/1990 |
| WO | WO9816837 A1 | 4/1998 |
| WO | WO9943066 A1 | 8/1999 |
| WO | WO2011026740 A1 | 3/2011 |
| WO | WO2013107371 A1 | 7/2013 |

OTHER PUBLICATIONS

Extended European Search Report for European Patent Application No. 18153830.7, dated May 23, 2018, 9 pages.
Extended European Search Report for European Patent Application No. 18153832.3, dated May 24, 2018, 9 pages.
Extended European Search Report for European Patent Application No. 19205621.6, dated Nov. 22, 2019, 9 pages.
Extended European Search Report for European Patent Application No. 18153834.9, dated May 29, 2018, 9 pages.
Extended European Search Report for European Patent Application No. 19203208.4, dated Nov. 18, 2019, 7 pages.
Extended European Search Report for European Patent Application No. 18153824.0, dated May 17, 2018, 9 pages.
Communication Pursuant to Article 94(3) EPC for European Patent Application No. 18153824.0, dated Jun. 12, 2019, 7 pages.
Communication Pursuant to Article 94(3) EPC for European Patent Application No. 18153824.0, dated Jan. 16, 2020, 5 pages.
Extended European Search Report for European Patent Application No. 18162251.5, dated Jul. 5, 2018, 9 pages.
Communication Pursuant to Article 94(3) EPC for European Patent Application No. 18162251.5, dated Jun. 12, 2019, 3 pages.
Cedric Gillet and Andreas Freidrich, "Guidelines for Designing a Concentrator for High-Current Sensing Applications with an Allegro Hall-Effect Sensor IC", 2013, 7 pages.
Magnetics Division of Sprang & Company, Technical Bulletin "Magnetic Cores for Hall Effect Devices", 1997, 6 pages.
Extended European Search Report for European Patent Application No. 19214929.2, dated May 4, 2020, 8 pages.
Extended European Search Report for European Patent Application No. 19216159.4, dated May 28, 2020, 9 pages.
Extended European Search Report for European Patent Application No. 19213783.4, dated Jun. 23, 2020, 7 pages.
Taheri S. et al.: "Equivalent Surface conductivity of ice accumulated on insulators during development of AC and DC flashovers arcs", IEEE Transactions on Dielectrics and Electrical Insulation, IEEE Service Center, Piscatawy, NJ, US, vol. 20, No. 5 Oct. 1, 2013, pp. 1789-1798, XP011530972, ISSN: 1070-9878.
Extended European Search Report for European Patent Application No. 19215831.9, dated Jul. 3, 2020, 11 pages.
Extended European Search Report for European Patent Application No. 19216276.6, dated Jul. 6, 2020, 10 pages.

* cited by examiner

ELECTRIC ARC DETECTION FOR PROBE HEATER PHM AND PREDICTION OF REMAINING USEFUL LIFE

BACKGROUND

The present disclosure relates generally to probes, and in particular to prognostics for air data probes.

Probes are utilized to determine characteristics of an environment. In aircraft systems, for example, air data probes may be implemented on the external portions of the aircraft to aid in determination of conditions such as airspeed, altitude, and angle of attack, among others. Due to the harsh conditions of flight at high altitudes, ice may build-up on portions of the air data probe. To combat this, heaters are implemented within the air data probe to prevent the formation of ice that may impact proper functionality of the air data probe.

When air data probes break down, they need to be replaced, often prior to a subsequent takeoff. The heater of an air data probe is often the most life-limited part. Therefore, air data probes need to be replaced as soon as the heater breaks down. It is desirable to predict when the air data probe will require replacement.

SUMMARY

A system for an aircraft includes an aircraft component that includes a heater routed through the aircraft component, the heater including a resistive heating element and insulation surrounding the resistive heating element. A first current flows into the resistive heating element to provide heating for the aircraft component and a second current flows out of the resistive heating element. The system further includes a first sensor configured to produce a first sensor signal representing the first current, a second sensor configured to produce a second sensor signal representing the second current, a leakage sensor configured to produce a leakage sensor signal representing a leakage current, and a signal processor configured to sample and measure the first current, the second current, and a leakage current using a high frequency sampling rate to identify the presence of electric arcing.

DETAILED DESCRIPTION

In general, the present disclosure describes measuring and sampling a main heater current and an insulation leakage current using a high frequency sampling rate (150 KHz to 500 KHz) to detect electric arcing that indicates future heater failure and can be used to estimate remaining useful life of the heater.

Figure 1:
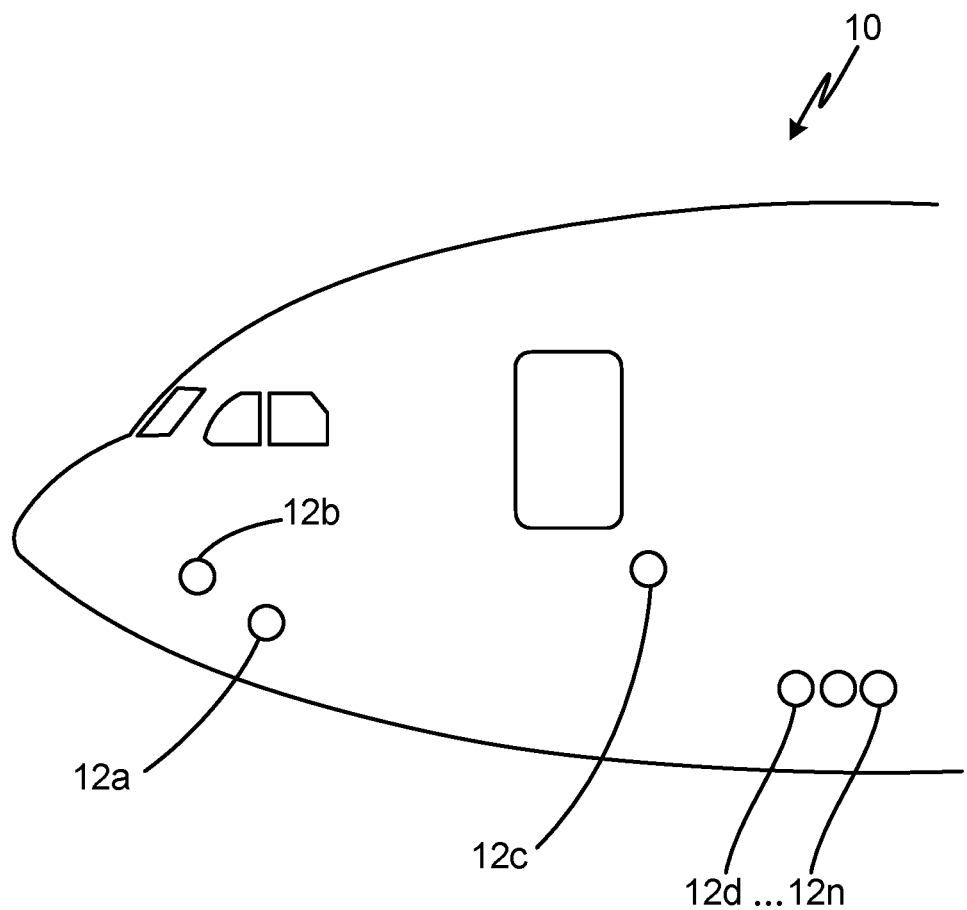
FIG. 1 is a diagram illustrating an aircraft that includes a plurality of air data probes.

FIG. 1 is a diagram illustrating aircraft 10 that includes a plurality of air data probes 12a-12n. While illustrated as a commercial aircraft, other vehicles, such as unmanned aerial vehicles, helicopters and ground vehicles may also include air data probes 12a-12n configured to sense characteristics of the environment. Air data probes 12a-12n are aircraft components. Air data probes 12a-12n may be any type of probe such as, but not limited to, pitot probes, pitot-static probes, total air temperature (TAT) probes, angle-of-attack (AOA) sensors, and any other probes that may include a heater.

Figure 2A:
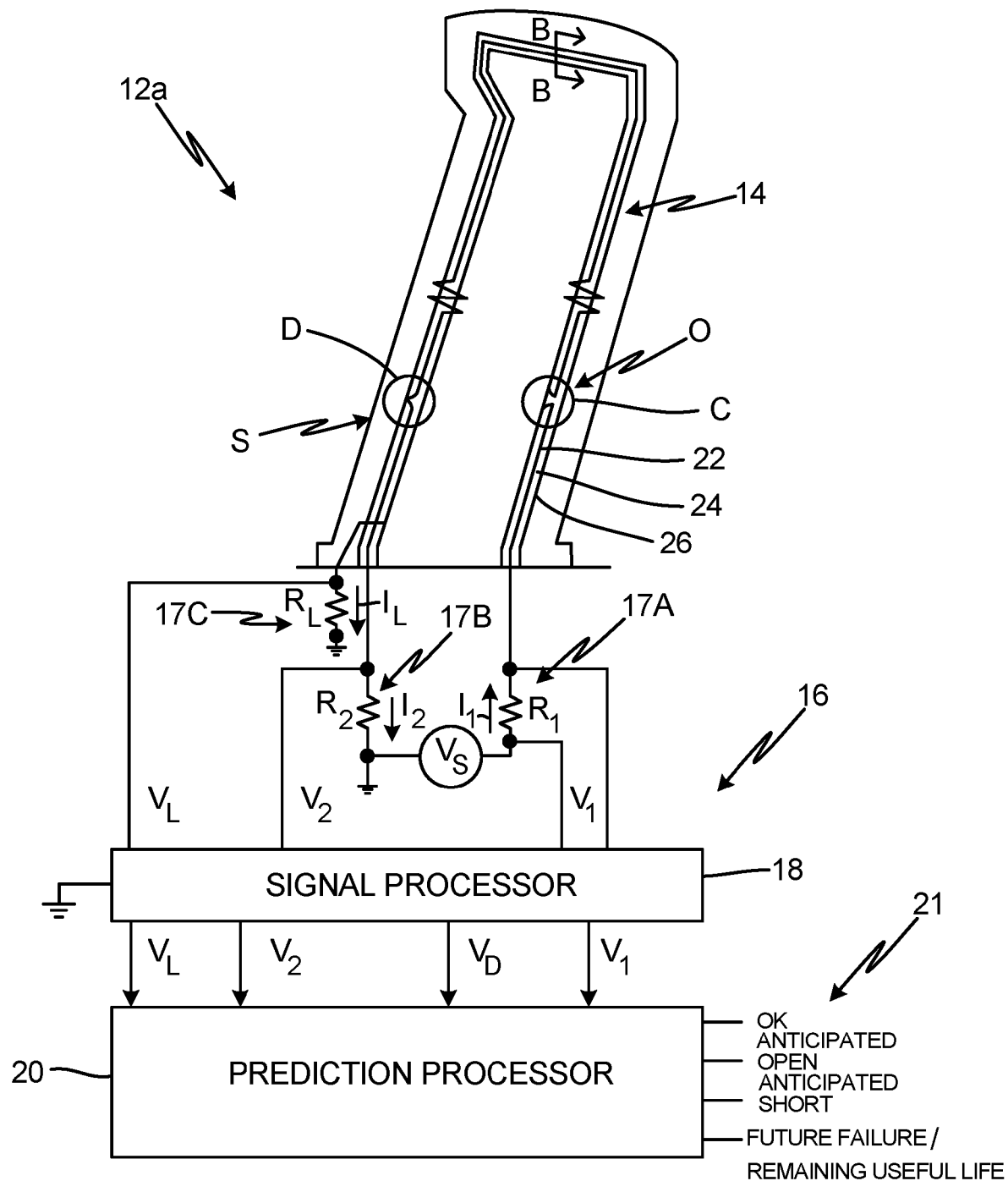
FIG. 2A is a diagram of an air data probe that includes a heater and circuitry that is electrically connected to the heater.
Figure 2B:
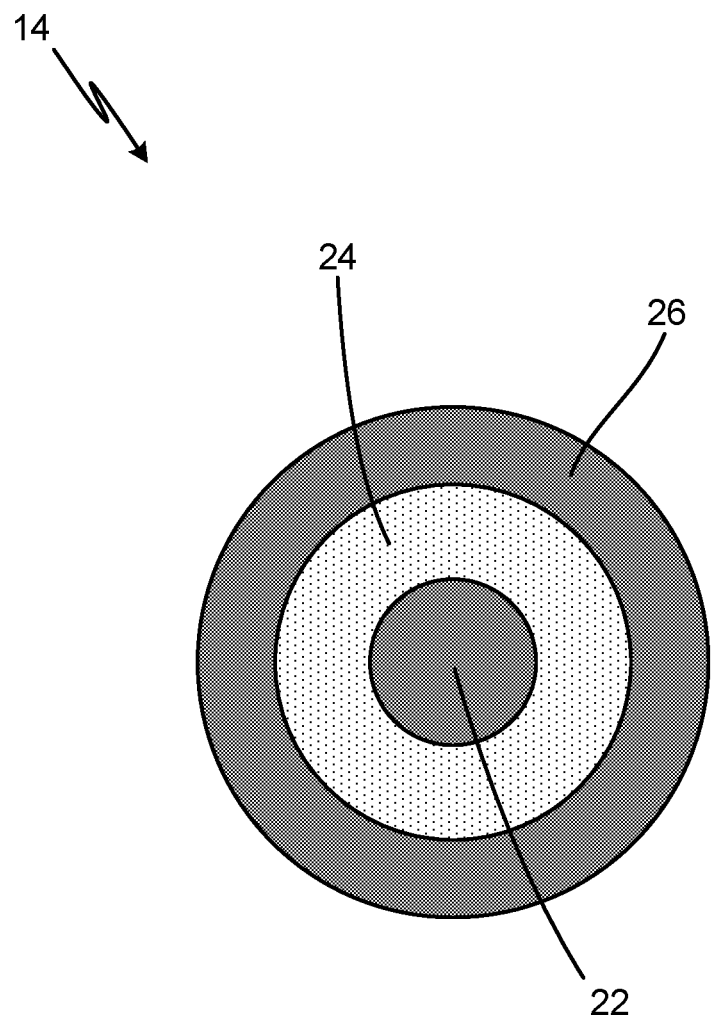
FIG. 2B is a cross-sectional view of the heater of the air data probe taken along line B-B of FIG. 2A.
Figure 2C:
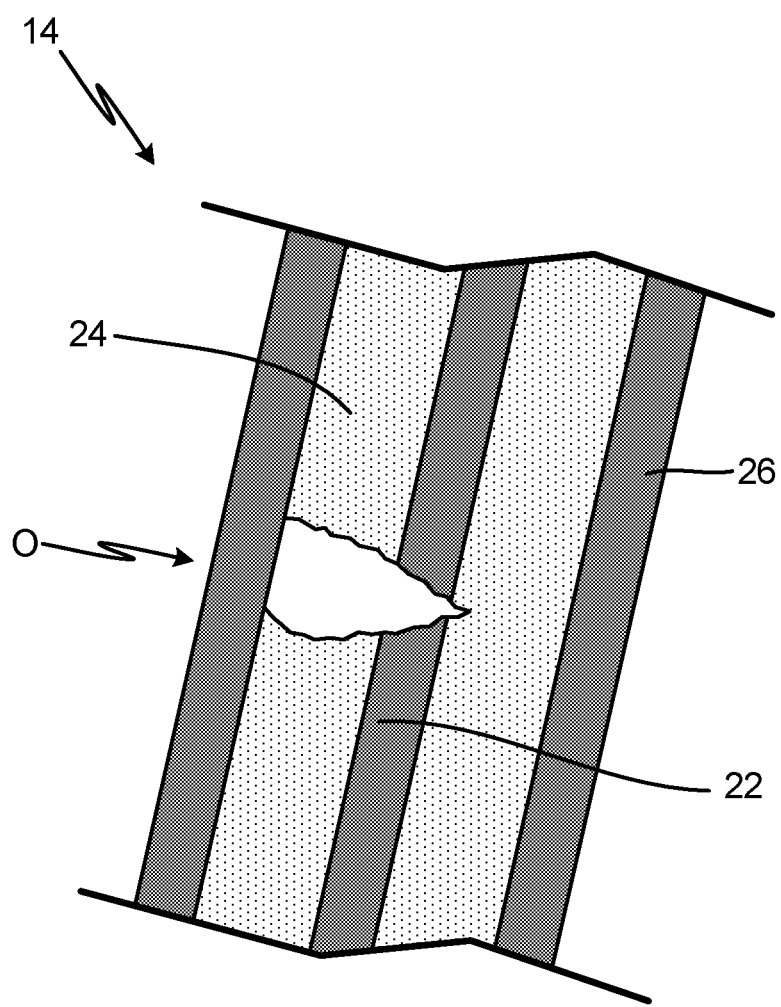
FIG. 2C is a partial cross-sectional view illustrating an open circuit in the heater.
Figure 2D:
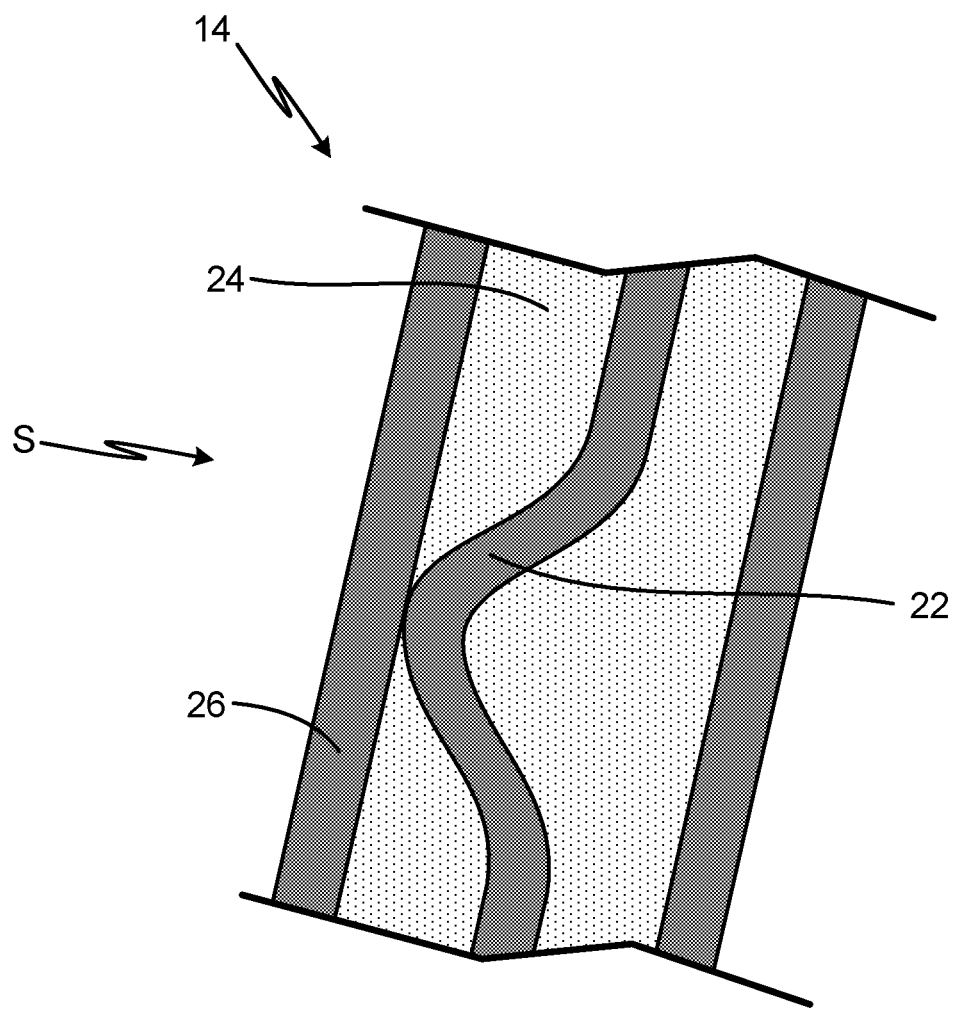
FIG. 2D is a partial cross-sectional view illustrating a short circuit in the heater.

FIG. 2A is a diagram of air data probe 12a that includes heater 14 and circuitry 16 that is electrically connected to heater 14. While illustrated in FIG. 2A as a TAT probe 12a, air data probe 12a may be any other type of air data probe 12a-12n or sensing element. FIG. 2B is a cross-sectional view of heater 14 of air data probe 12a taken along line B-B of FIG. 2A. FIG. 2C is a partial cross-sectional view illustrating open circuit O in heater 14. FIG. 2D is a partial cross-sectional view illustrating short circuit S in heater 14. FIGS. 2A, 2B, 2C, and 2D will be discussed together.

Air data probe 12a is an aircraft component and includes heater 14. Air data probe 12a is electrically connected to circuitry 16, which includes voltage source Vs, first sensor 17A, second sensor 17B, leakage sensor 17C, signal processor 18, and prediction processor 20. Heater 14 includes resistive heating element 22, insulation 24, and sheath 26.

Heater 14, which may be a heater wire, for example, is routed through air data probe 12a and is electrically connected to circuitry 16 within aircraft 10. Heater 14 receives power from electrically connected voltage source Vs of circuitry 16 to provide heating for air data probe 12a. Voltage source Vs may provide direct current (DC) power or alternating current (AC) power to heater 14 depending on the type of air data probe 12a within which heater 14 is positioned. First current $I_1$ is main current flowing at a first end of heater 14. Second current $I_2$ is main current flowing at a second end of heater 14, which is opposite the first end of heater 14. For example, as seen in FIG. 2A, first current $I_1$ (which may be DC or AC current) flows into heater 14, and second current $I_2$ (which may be DC or AC current) flows out of heater 14. First current $I_1$ flows through first sensor 17A to produce a sensed voltage, or first sensor signal $V_1$. In this embodiment, first sensor 17A is first sense resistor $R_1$. Second current $I_2$ flows through second sensor 17B to produce a sensed voltage, or second sensor signal $V_2$. In this embodiment, second sensor 17B is second sense resistor $R_2$. Leakage current $I_L$ is current that has leaked from heater 14 to electrical ground. Leakage current $I_L$ flows through leakage sensor 17C to produce a sensed voltage, or leakage sensor signal $V_L$. In this embodiment, leakage sensor 17C is leakage sense resistor $R_L$. Because first sense resistor $R_1$, second sense resistor $R_2$, and leakage sense resistor $R_L$ are known resistors, first sensor signal $V_1$, second sensor signal $V_2$, and leakage sensor signal $V_L$ have known relationships to first current $I_1$, second current $I_2$, and leakage current $I_L$. First sensor signal $V_1$, second sensor signal $V_2$, and leakage sensor signal $V_L$, which represent first current $I_1$, second current $I_2$, and leakage current $I_L$, respectively, vary as a function of time. In alternate embodiments, first sensor 17A, second sensor 17B, and leakage sensor 17C may be any suitable sensors.

Signal processor 18 is electrically connected to heater 14. Time varying first sensor signal $V_1$, second sensor signal $V_2$, and leakage sensor signal $V_L$ are provided to signal processor 18. Signal processor 18 creates difference voltage $V_D$ by subtracting second sensor signal $V_2$ from first sensor signal $V_1$. First sensor signal $V_1$ and second sensor signal $V_2$ are representative of current at opposite ends of heater 14. Thus, $V_D$ represents the difference between first current $I_1$ and second current $I_2$, which is representative of current that has leaked from heater 14 and is therefore equal to leakage sensor signal $V_L$, as a function of time. First sensor signal $V_1$, second sensor signal $V_2$, leakage sensor signal $V_L$, and difference voltage $V_D$ are digitized, filtered, and transformed from the time domain to the frequency domain to produce Fourier transformed data representing first sensor signal $V_1$, second sensor signal $V_2$, leakage sensor signal $V_L$, and difference voltage $V_D$ as functions of frequency. Signal processor 18 outputs Fourier transformed data representing first sensor signal $V_1$, second sensor signal $V_2$, leakage sensor signal $V_L$, and difference voltage $V_D$. Fourier transformed data representing first sensor signal $V_1$, second sensor signal $V_2$, leakage sensor signal $V_L$, and difference voltage $V_D$ indicate whether electric arcing has occurred in heater 14. First sensor signal $V_1$, second sensor signal $V_2$, leakage sensor signal $V_L$, and difference voltage $V_D$ in the time domain are also digitized and filtered such that signal processor 18 also outputs first sensor signal $V_1$, second sensor signal $V_2$, leakage sensor signal $V_L$, and difference voltage $V_D$ as functions of time.

Prediction processor 20 is electrically connected to signal processor 18 to receive Fourier transformed data representing first sensor signal $V_1$, second sensor signal $V_2$, leakage sensor signal $V_L$, and difference voltage $V_D$ from signal processor 18. Prediction processor 20 also receives first sensor signal $V_1$, second sensor signal $V_2$, leakage sensor signal $V_L$, and difference voltage $V_D$ in the time domain from signal processor 18. Prediction processor 20 uses Fourier transformed data representing first sensor signal $V_1$, second sensor signal $V_2$, leakage sensor signal $V_L$, and difference voltage $V_D$, in addition to first sensor signal $V_1$, second sensor signal $V_2$, leakage sensor signal $V_L$, and difference voltage $V_D$, to output status 21 of heater 14. Heater 14 may have a status 21 of OK, ANTICIPATED OPEN, ANTICIPATED SHORT, and/or FUTURE FAILURE/REMAINING USEFUL LIFE.

As seen in FIG. 2B, heater 14 has resistive heating element 22, which is a resistor that receives first current $I_1$ from voltage source Vs and outputs second $I_2$ to voltage source Vs. First current $I_1$ flows into resistive heating element 22, and second current $I_2$ flows out of resistive heating element 22. Resistive heating element 22 may be made of oxidation resistant material such as Nichrome, or any other suitable material. Insulation 24 surrounds resistive heating element 22. Insulation 24 may be made of silica, ceramic, or any other suitable insulating material. Sheath 26 is metallic and surrounds insulation 24 such that insulation 24 is between resistive heating element 22 and sheath 26. Sheath 26 may be made of nickel alloy, copper alloy, or any other suitable oxidation resistant material.

Heater 14 prevents ice from building up on air data probe 12a when air data probe 12a is exposed to cold temperatures when flying at high altitudes. Voltage source Vs supplies power to resistive heating element 22 such that first current $I_1$ is provided to and driven through resistive heating element 22, producing the required heat for air data probe 12a, and second current $I_2$ flows out of resistive heating element 22.

Insulation 24 protects resistive heating element 22 and electrically insulates resistive heating element 22. For example, resistive heating element 22 is insulated from metallic sheath 26 by insulation 24. Sheath 26 protects resistive heating element 22 and insulation 24, such as by keeping moisture and contaminants from compromising insulation 24.

If sheath 26 cracks, oxygen, moisture, dust, carbon, oils, and other contaminants can leak through sheath 26 to insulation 24, and then to resistive heating element 22, causing the material of insulation 24 and resistive heating element 22 to oxidize, change properties, and/or otherwise break down. Loss of function of insulation 24 leads to resistive heating element 22 shorting to sheath 26, or short circuit S. Cracking and deterioration of resistive heating element 22 may lead to open circuit O. For example, oxidation or cracking of insulation 24 can lead to a gap in insulation 24 and resistive heating element 22, or open circuit O, and loss of function of heater 14, as shown in FIG. 2C. Additionally, loss of function of insulation 24 can cause resistive heating element 22 to contact sheath 26, or short circuit S, and loss of function of heater 14, as shown in FIG. 2D. Open circuit O and short circuit S both represent failures of heater 14 as current is no longer able to flow through heater 14. In early stages of open circuit O and short circuit S, intermittent electric arcing occurs as a result of electric discharge through small conductive air gaps in insulation 24. The ionization of air in the gaps in insulation 24 allows electric charges to pass through the air, producing plasma that may result in visible light. As resistive heating element 22 deteriorates, such as in open circuit O, electric arcing can also occur within resistive heating element 22. In cases of short circuit S, electric arcing can occur between resistive heating element 22 and sheath 26. Electric arcing can lead to either temporary restoration of function of heater 14 due to closing a gap in the case of open circuit O or opening a gap in the case of short circuit S. Electric arcing typically manifests itself in sensor signal $V_1$, second sensor signal $V_2$, and leakage sensor signal $V_L$ at a much higher frequency range than the operating frequencies. For example, electric arcing may manifest at a range of about 50 KHz to about 200 KHz.

Signal processor 18 samples and measures first sensor signal $V_1$, second sensor signal $V_2$, and leakage sensor signal $V_L$, which represent first current $I_1$, second current $I_2$, and leakage current $I_L$, respectively, from heater 14 using a high frequency sampling rate. The high frequency sampling rate is at least greater than two times the highest frequency of the electrical noise produced by electric arcing (which may be limited by an anti-aliasing filter), such as from about 150 KHz to about 500 KHz.

Because electric arcing is a precursor to open circuit O or short circuit S failure of heater 14, prediction processor 20 determines status 21 of heater 14 based on the presence of electric arcing. Electric arcing manifests itself as a high frequency noise in first sensor signal $V_1$, second sensor signal $V_2$, leakage sensor signal $V_L$, and difference voltage $V_D$. Such high frequency noise is identified in Fourier transformed data representing first sensor signal $V_1$, second sensor signal $V_2$, leakage sensor signal $V_L$, and difference voltage $V_D$. Prediction processor identifies the presence of electric arcing in heater 14 based on detection of high frequency noise to determine future failure of heater 14.

Prediction processor 20 will output a status of OK, indicating heater 14 is functioning properly, when there is no high frequency noise in Fourier transformed data representing first sensor signal $V_1$, second sensor signal $V_2$, leakage sensor signal $V_L$, and difference voltage $V_D$. Prediction processor 20 will output a status of ANTICIPATED OPEN, indicating an imminent future open circuit O, when there is high frequency noise in Fourier transformed data representing first sensor signal $V_1$ and second sensor signal $V_2$ and no increase or elevation in signal levels of leakage sensor signal $V_L$ and difference voltage $V_D$. Prediction processor 20 will output a status of ANTICIPATED SHORT, indicating an imminent future short circuit S, when there is high frequency noise in Fourier transformed data representing first sensor signal $V_1$ and second sensor signal $V_2$ as well as high frequency noise in Fourier transformed data representing leakage sensor signal $V_L$ and difference voltage $V_D$, in addition to a noticeable increase or elevation in signal levels of leakage sensor signal $V_L$ and difference voltage $V_D$. Prediction processor 20 will output a status of FUTURE FAILURE/REMAINING USEFUL LIFE, indicating the remaining useful life of heater 14, based on signatures (specific shapes) and magnitudes of Fourier transformed data representing first sensor signal $V_1$, second sensor signal $V_2$, leakage sensor signal $V_L$, and difference voltage $V_D$. While described with reference to leakage sensor signal $V_L$ and difference voltage $V_D$, prediction processor 20 may make the same predictions using only leakage sensor signal $V_L$ (representing leakage current), if signal processor 18 does not create difference voltage $V_D$ or using only difference voltage $V_D$ (representing leakage current), if leakage sensor signal $V_L$ is not provided to signal processor 18.

Heater 14 ensures air data probe 12a is functioning properly. Heater 14 can abruptly fail as a result of open circuit O or short circuit S, which causes a sudden loss of functionality of air data probe 12a. Because proper functioning of air data probe 12a is necessary for safe operation of aircraft 10, prognostics of heater 14 improves the reliability of air data probe 12a. Predicting future failure of heater 14 allows a user to replace heater 14 when necessary (such as between flights or at another convenient time) and prevents unpredictable failures of heater 14, which reduces flight delays, improves flight safety, and lowers aircraft maintenance and flight operation costs.

Figure 3:
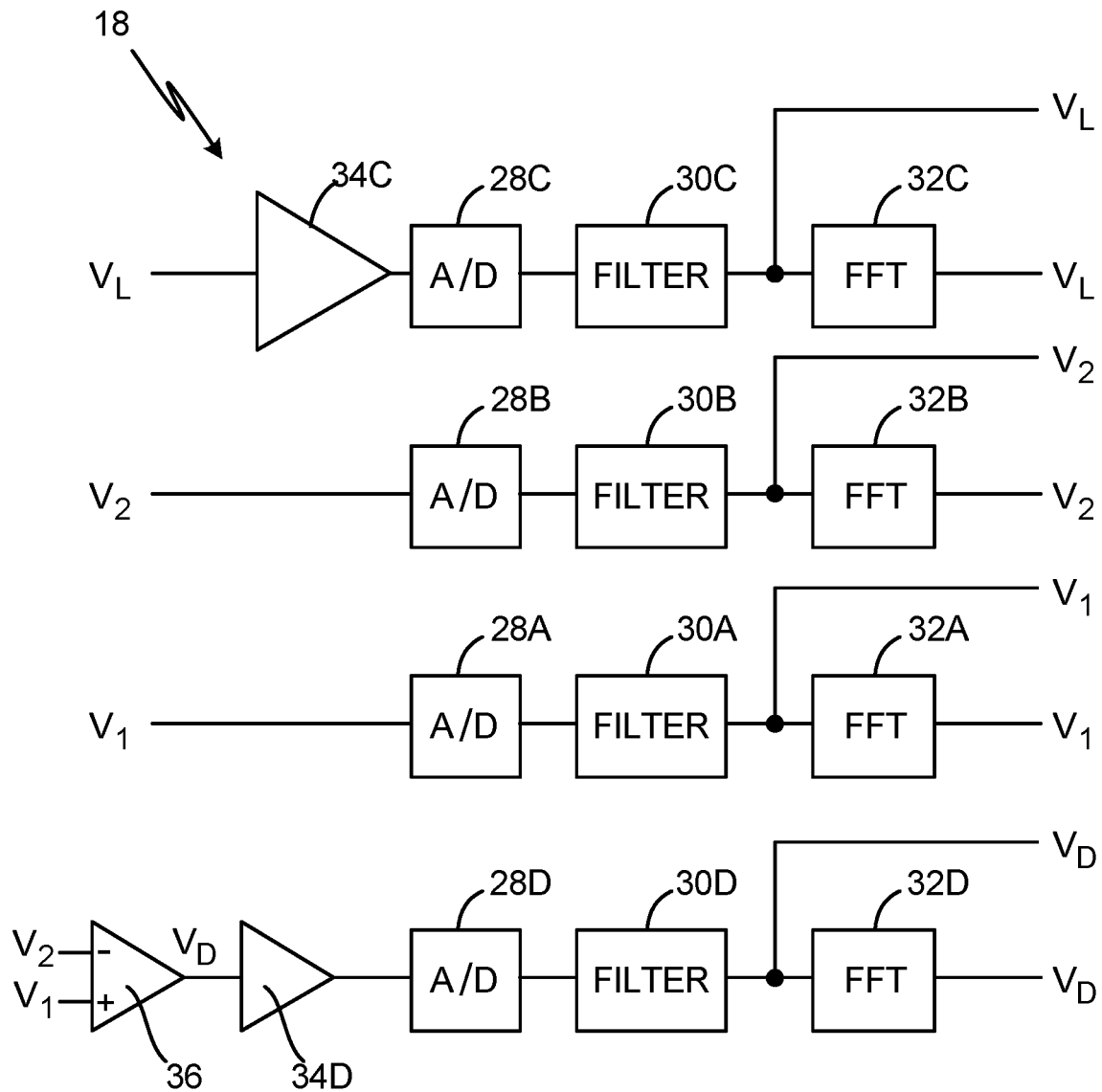
FIG. 3 is a diagram illustrating functions of a signal processor.

FIG. 3 is a diagram illustrating functions of signal processor 18, which include producing digitized and filtered first sensor signal $V_1$, second sensor signal $V_2$, leakage sensor signal $V_L$, and difference voltage $V_D$ as a function of time and producing digitized and filtered first sensor signal $V_1$, second sensor signal $V_2$, leakage sensor signal $V_L$, and difference voltage $V_D$ as a function of frequency. Signal processor 18 carries out A/D conversion 28A-28D, filtering 30A-30D, and fast Fourier transformation 32A-32D on first sensor signal $V_1$, second sensor signal $V_2$, leakage sensor signal $V_L$, and difference voltage $V_D$. Additionally, signal processor 18 includes amplifiers 34C and 34D and comparator 36.

Signal processor 18 accepts first sensor signal $V_1$ Signal processor 18 digitizes first sensor signal $V_1$ using A/D converter 28A and uses filter 30A to filter the digitized first sensor signal $V_1$ to a frequency range of interest, such as a frequency range from about 50 KHz to about 200 KHz. Signal processor 18 utilizes fast Fourier transform 32A to produce Fourier transformed data representing first sensor signal $V_1$. Fourier transformed data representing first sensor signal $V_1$ represents first sensor signal $V_1$ as a function of frequency, which represents first current $I_1$ of heater 14.

Signal processor 18 accepts second sensor signal $V_2$. Signal processor 18 digitizes second sensor signal $V_2$ using A/D converter 28B and uses filter 30B to filter the digitized second sensor signal $V_2$ to a frequency range of interest, such as a frequency range from about 50 KHz to about 200 KHz. Signal processor 18 utilizes fast Fourier transform 32B to produce Fourier transformed data representing second sensor signal $V_2$. Fourier transformed data representing second sensor signal $V_2$ represents second sensor signal $V_2$ as a function of frequency, which represents second current $I_2$ of heater 14.

Signal processor 18 accepts leakage sensor signal $V_L$. Signal processor 18 amplifies leakage sensor signal $V_L$ using amplifier 34C and digitizes amplified leakage sensor signal $V_L$ using A/D converter 28C. Signal processor 18 uses filter 30C to filter the digitized leakage sensor signal $V_L$ to a frequency range of interest, such as a frequency range from about 50 KHz to about 200 KHz. Signal processor 18 utilizes fast Fourier transform 32C to produce Fourier transformed data representing leakage sensor signal $V_L$. Fourier data representing leakage sensor signal $V_L$ represents leakage sensor signal $V_L$ as a function of frequency, which represents leakage current $I_L$ of heater 14.

Signal processor 18 accepts first sensor signal $V_1$ and second sensor signal $V_2$. Signal processor 18 uses comparator 36 to subtract second sensor signal $V_2$ from first sensor signal $V_1$ to create difference voltage $V_D$. Signal processor 18 amplifies difference voltage $V_D$ using amplifier 34D and digitizes amplified difference voltage $V_D$ using A/D converter 28D. Signal processor 18 uses filter 30D to filter the digitized difference voltage $V_D$ to a frequency range of interest, such as from about 50 KHz to about 200 KHz. Signal processor 18 uses fast Fourier transform 32D to produce Fourier transformed data representing difference voltage $V_D$. Fourier data representing difference voltage $V_D$ represents difference voltage $V_D$ as a function of frequency, which represents leakage current $I_L$ of heater 14.

Signal processor 18 samples first sensor signal $V_1$, second sensor signal $V_2$, leakage sensor signal $V_L$, and difference voltage $V_D$ at a rate of at least twice the frequency of the frequency range of interest, such as from about 150 KHz to about 500 KHz. First sensor signal $V_1$, second sensor signal $V_2$, leakage sensor signal $V_L$, and difference voltage $V_D$ are digitized, filtered, and transformed into a frequency domain so that the frequency spectrum of each of first sensor signal $V_1$, second sensor signal $V_2$, leakage sensor signal $V_L$, and difference voltage $V_D$ can be analyzed. Analysis of the frequency spectrum of each of first sensor signal $V_1$, second sensor signal $V_2$, leakage sensor signal $V_L$, and difference voltage $V_D$, in addition to monitoring signal levels of first sensor signal $V_1$, second sensor signal $V_2$, leakage sensor signal $V_L$, and difference voltage $V_D$ in the time domain, can determine the presence of high frequency noise, which is indicative of electric arcing. Frequency data is delivered to prediction processor 20, which determines status 21 of heater 14 based off such data, including a remaining useful life of heater 14.

While described with respect to high frequency sampling, electric arcing may also be detected using lower frequency sampling. At lower frequency sampling rates, electric arcing may manifest as random high amplitude pulses and random noise in time signal data for leakage sensor signal $V_L$ and difference voltage $V_D$. As such, future failure of heater 14 and remaining useful life of heater 14 may also be identified at lower frequency sampling rates.

Further, while described with respect to air data probes, such as air data probe 12a, heater 14 may be any heater of any suitable aircraft component, such as a wind ice protection heater.

Discussion of Possible Embodiments

The following are non-exclusive descriptions of possible embodiments of the present invention.

A system for an aircraft includes an aircraft component that includes a heater routed through the aircraft component, the heater comprising: a resistive heating element; and insulation surrounding the resistive heating element; wherein a first current flows into the resistive heating element to provide heating for the aircraft component and a second current flows out of the resistive heating element; a first sensor configured to produce a first sensor signal representing the first current; a second sensor configured to produce a second sensor signal representing the second current; a leakage sensor configured to produce a leakage sensor signal representing a leakage current; and a signal processor configured to sample and measure the first current, the second current, and a leakage current using a high frequency sampling rate to identify the presence of electric arcing.

The system of the preceding paragraph can optionally include, additionally and/or alternatively, any one or more of the following features, configurations and/or additional components:

A prediction processor configured to determine future heater failure based on the electric arcing.

A prediction processor configured to determine remaining useful life of the aircraft component.

A prediction processor configured to identify the presence of electric arcing in the heater based on high frequency noise in the first current and the second current.

The signal processor is configured to digitize the first sensor signal, the second sensor signal, the leakage sensor signal, and a difference voltage, the difference voltage being the difference between the first sensor signal and the second sensor signal.

The signal processor is configured to amplify the leakage sensor signal.

The signal processor samples the first sensor signal, the second sensor signal, and the leakage sensor signal at a frequency of about 150 KHz to about 500 KHz.

The signal processor filters the first sensor signal, the second sensor signal, and the leakage sensor signal to a frequency range from about 50 KHz to about 200 KHz.

A prediction processor configured to predict a remaining useful life of the heater based on the signatures and magnitudes of Fourier transformed data representing the first sensor signal, the second sensor signal, and the leakage sensor signal.

The signal processor is configured to output Fourier transformed data representing the first sensor signal, the second sensor signal, and the leakage sensor signal.

A prediction processor configured to identify a future short circuit or a future open circuit based upon the Fourier transformed data representing the first sensor signal, the second sensor signal, and the leakage sensor signal.

A prediction processor configured to identify a future open circuit when the Fourier transformed data representing the first sensor signal and the second sensor signal indicate high frequency noise and the leakage sensor signal is not elevated.

A prediction processor configured to identify a future short circuit when the Fourier transformed data representing the first sensor signal and the second sensor signal indicate high frequency noise, the Fourier transformed data representing the leakage sensor signal also indicates high frequency noise, and the leakage sensor signal is elevated.

The signal processor is configured to output Fourier transformed data representing the difference between the first sensor signal and the second sensor signal, which is equal to the leakage sensor signal.

The heater further comprises a metallic sheath surrounding the insulation such that the insulation is between the resistive heating element and the metallic sheath.

A voltage source to provide the first current to the resistive heating element.

The first current and the second current provided to the resistive heating element may be AC or DC power.

The first sensor is a first sense resistor, the second sensor is a second sense resistor, and the leakage sensor is a leakage sense resistor.

The signal processor samples the first sensor signal, the second sensor signal, and the leakage sensor signal at a frequency greater than two times the highest frequency of electrical noise produced by electric arcing.

The aircraft component is an air data probe.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for an aircraft, the system comprising:
an aircraft component that includes a heater routed through the aircraft component, the heater comprising:
 a resistive heating element; and
 insulation surrounding the resistive heating element;
 wherein a first current flows into the resistive heating element to provide heating for the aircraft component and a second current flows out of the resistive heating element;
a first sensor configured to produce a first sensor signal representing the first current;
a second sensor configured to produce a second sensor signal representing the second current;
a leakage sensor configured to produce a leakage sensor signal representing a leakage current; and
a signal processor configured to sample and measure the first current, the second current, and a leakage current using a high frequency sampling rate to identify the presence of electric arcing.

2. The system of claim 1, further including a prediction processor configured to determine future heater failure based on the electric arcing.

3. The system of claim 1, further including a prediction processor configured to determine remaining useful life of the aircraft component.

4. The system of claim 1, further including a prediction processor configured to identify the presence of electric arcing in the heater based on high frequency noise in the first current and the second current.

5. The system of claim 1, wherein the signal processor is configured to digitize the first sensor signal, the second sensor signal, the leakage sensor signal, and a difference voltage, the difference voltage being the difference between the first sensor signal and the second sensor signal.

6. The system of claim 1, wherein the signal processor is configured to amplify the leakage sensor signal.

7. The system of claim 1, wherein the signal processor samples the first sensor signal, the second sensor signal, and the leakage sensor signal at a frequency of about 150 KHz to about 500 KHz.

8. The system of claim 1, wherein the signal processor filters the first sensor signal, the second sensor signal, and the leakage sensor signal to a frequency range from about 50 KHz to about 200 KHz.

9. The system of claim 1, further including a prediction processor configured to predict a remaining useful life of the heater based on the signatures and magnitudes of Fourier transformed data representing the first sensor signal, the second sensor signal, and the leakage sensor signal.

10. The system of claim 1, wherein the signal processor is configured to output Fourier transformed data representing the first sensor signal, the second sensor signal, and the leakage sensor signal.

11. The system of claim 10, further including a prediction processor configured to identify a future short circuit or a future open circuit based upon the Fourier transformed data representing the first sensor signal, the second sensor signal, and the leakage sensor signal.

12. The system of claim 10, further including a prediction processor configured to identify a future open circuit when the Fourier transformed data representing the first sensor signal and the second sensor signal indicate high frequency noise and the leakage sensor signal is not elevated.

13. The system of claim 10, further including a prediction processor configured to identify a future short circuit when the Fourier transformed data representing the first sensor signal and the second sensor signal indicate high frequency noise, the Fourier transformed data representing the leakage sensor signal also indicates high frequency noise, and the leakage sensor signal is elevated.

14. The system of claim 10, wherein the signal processor is configured to output Fourier transformed data representing the difference between the first sensor signal and the second sensor signal, which is equal to the leakage sensor signal.

15. The system of claim 1, wherein the heater further comprises a metallic sheath surrounding the insulation such that the insulation is between the resistive heating element and the metallic sheath.

16. The system of claim 1, further comprising a voltage source to provide the first current to the resistive heating element.

17. The system of claim 1, wherein the first current and the second current provided to the resistive heating element may be AC or DC power.

18. The system of claim 1, wherein the first sensor is a first sense resistor, the second sensor is a second sense resistor, and the leakage sensor is a leakage sense resistor.

19. The system of claim 1, wherein the signal processor samples the first sensor signal, the second sensor signal, and the leakage sensor signal at a frequency greater than two times the highest frequency of electrical noise produced by electric arcing.

20. The system of claim 1, wherein the aircraft component is an air data probe.

* * * * *